(12) United States Patent
Pricer et al.

(10) Patent No.: US 6,303,456 B1
(45) Date of Patent: Oct. 16, 2001

(54) METHOD FOR MAKING A FINGER CAPACITOR WITH TUNEABLE DIELECTRIC CONSTANT

(75) Inventors: Wilbur David Pricer, Charlotte; Anthony Kendall Stamper, Williston, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/514,044

(22) Filed: Feb. 25, 2000

(51) Int. Cl.$^7$ ................................................. H01L 21/336
(52) U.S. Cl. .......................... 438/388; 438/386; 438/387; 438/391
(58) Field of Search ................................. 438/386–395; 257/301, 305, 309

(56) References Cited

U.S. PATENT DOCUMENTS

| | | | |
|---|---|---|---|
| 4,697,159 | 9/1987 | Sechi et al. | 333/24 |
| 4,785,202 | 11/1988 | Toyoda | 307/443 |
| 4,859,622 | * 8/1989 | Eguchi | 438/389 |
| 5,162,258 | 11/1992 | Lemnios et al. | 438/184 |
| 5,204,208 | * 4/1993 | Dhong et al. | 438/386 |
| 5,208,725 | 5/1993 | Akcasu | 361/313 |
| 5,241,201 | 8/1993 | Matsuo et al. | 257/309 |
| 5,245,505 | 9/1993 | Shiga et al. | 361/311 |
| 5,248,628 | 9/1993 | Okabe et al. | 438/47 |
| 5,313,089 | 5/1994 | Jones | 257/292 |
| 5,369,296 | 11/1994 | Kato | 257/295 |
| 5,406,447 | 4/1995 | Miyazaki | 301/313 |
| 5,479,316 | 12/1995 | Smrtic et al. | 361/322 |
| 5,592,412 | * 1/1997 | Kleinheinz et al. | 365/149 |
| 5,644,151 | 7/1997 | Izumi et al. | 257/306 |
| 5,661,319 | 8/1997 | Fujii et al. | 257/295 |
| 5,717,236 | 2/1998 | Shinkawata | 257/306 |
| 5,741,721 | 4/1998 | Stevens | 438/60 |
| 5,747,845 | 5/1998 | Iwasa | 257/306 |
| 5,753,948 | 5/1998 | Nguyen et al. | 257/307 |
| 5,789,818 | 8/1998 | Havemann | 257/750 |
| 5,793,076 | 8/1998 | Fazan et al. | 257/298 |
| 5,811,868 | 9/1998 | Bertin et al. | 257/516 |
| 5,838,032 | 11/1998 | Ting | 257/211 |
| 5,851,870 | 12/1998 | Alugbin et al. | 438/239 |
| 5,869,860 | 2/1999 | Widmann | 257/304 |
| 5,877,522 | 3/1999 | Kasai | 257/306 |
| 5,879,981 | 3/1999 | Tanigawa | 438/241 |
| 5,879,985 | 3/1999 | Gambino et al. | 438/253 |
| 5,889,300 | 3/1999 | Figura et al. | 257/303 |

* cited by examiner

Primary Examiner—Charles Bowers
Assistant Examiner—William M. Brewster
(74) Attorney, Agent, or Firm—Richard A. Henkler; Venable, Baetjer, Howard & Civiletti, LLP

(57) ABSTRACT

A method of making finger capacitors in an integrated circuit comprises forming a plurality of conductive strips in a substrate having a first dielectric constant, removing a portion of the substrate material between the conductive strips to define a space and then filling the space with a material having a second dielectric constant which is greater than the first dielectric constant. By selecting the proportion of the high and low dielectric constant materials, the capacitance of the finger capacitors can be selected to have any value from a minimum, in which very little of the original, first dielectric constant material is removed and replaced by the second dielectric constant material, to a maximum, in which all of the first dielectric constant material between the conductive strips is removed and replaced with the second dielectric constant material.

15 Claims, 3 Drawing Sheets

METHOD FOR MAKING A FINGER CAPACITOR WITH TUNEABLE DIELECTRIC CONSTANT

BACKGROUND OF THE INVENTION

Modern desktop microprocessors draw as much as 30 amps of current. Therefore, filtering the power supply for modern desktop microprocessors becomes a problem.

There is a need for a bypass capacitor to absorb current surges. There is also a need for precision capacitors for analog applications. Analog applications require precision capacitors with minimal parasitic capacitance between either of the capacitor's nodes and yet other circuit nodes. High dielectric constants help minimize the size of the precision capacitors and thus tend to minimize parasitic elements. However, integrated capacitors having a high dielectric constant have been impractical due to integration difficulties. In addition, the variability of high dielectric constant materials has made these materials unattractive for analog work.

SUMMARY OF THE INVENTION

By the present invention, capacitors having a high dielectric constant are integrated in silicon substrates having integrated circuits. Furthermore, the capacitors can be tuned, that is, their effective dielectric constant and, thus, their capacitance can be selected precisely to have any value between a minimum and a maximum. Through such a selection, the variability associated with high dielectric constant materials can be tuned out.

The above advantages are obtained by forming a plurality of conductive strips in a substrate having a first dielectric constant to define finger capacitors, removing a portion of the substrate material between the conductive strips to define a space and then filling the space with a material having a second dielectric constant which is greater than the first dielectric constant. In this way, the capacitance of the finger capacitors can be selected to have any value from a minimum, in which very little of the original first dielectric constant material is removed and replaced by the second dielectric constant material, to a maximum, in which all of the first dielectric constant material between the finger capacitors is removed and replaced with the second dielectric constant material, which has a greater dielectric constant. The substrate material can be removed and the resulting spaces can be filled with a material having a second dielectric constant using conventional semiconductor fabrication techniques.

DETAILED OF THE PREFERRED EMBODIMENTS

Figure 1A:
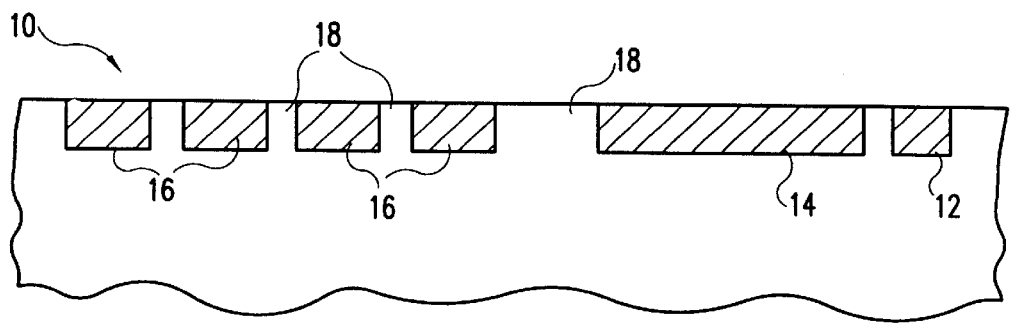
FIG. 1A is a schematic cross-section through a semiconductor wafer having finger capacitors, wirebond padd, and wires, all at a last metal level of the wafer.

As can be appreciated from FIG. 1A, a wafer to incorporate the present invention, which is designated generally by the reference numeral 10, has a silicon substrate with devices fabricated on the silicon substrate and a number of levels of insulation and metal produced by conventional processes. The last damascene metal wiring level has standard wires 12, wirebond pads 14, fuses (not shown) and the like, as well as conductive elements defining capacitors, such as strips 16 defining finger capacitors. These are formed in a first dielectric material 18, such as SiO2-based glass, which has a relatively low dielectric constant. Thus, without any change to the structure of the first dielectric material 18 and the conductive strips 16, the capacitors they define have a relatively low capacitance.

Figure 1B:
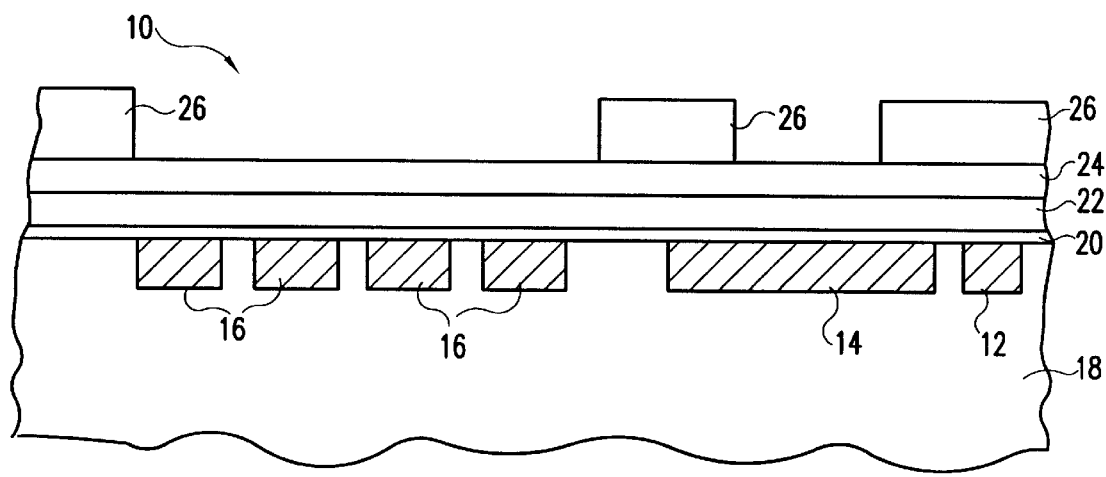
FIG. 1B shows the wafer of FIG. 1A after final passivation dielectric deposition and a first terminal via photoresist patterning.

As can be seen from FIG. 1B, a final passivation dielectric comprising, for example, a layer of nitride 20, a layer of oxide 22, and a second layer of nitride 24 is deposited on the last metal level, and a photoresist material 26 is formed in desired areas to define, for example, the first terminal via (TV) photoresist patterning.

Figure 1C:
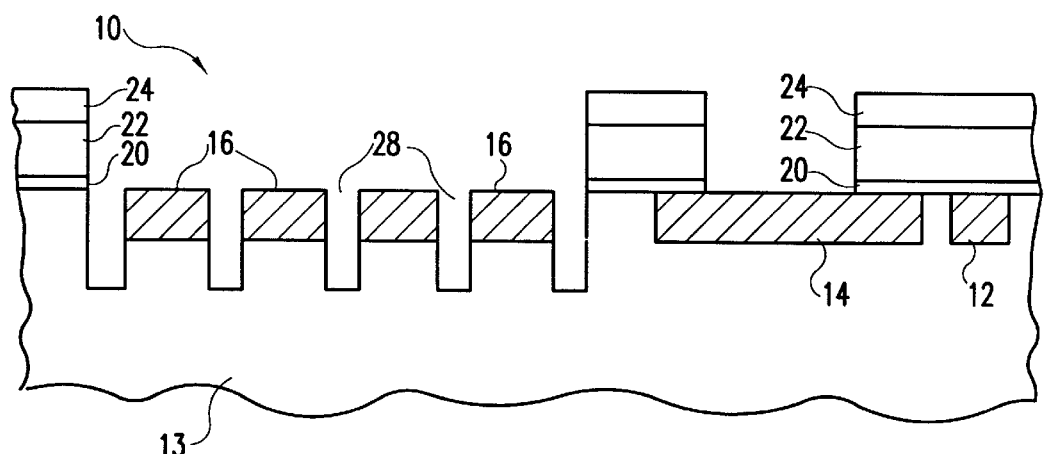
FIG. 1C shows the wafer of FIG. 1B after a terminal via etch and a stripping of the photoresist.

As can be seen from FIG. 1C, the wafer 10 of FIG. 1B is etched with what sometimes called a terminal via etch, and the photoresist material 26 is stripped. The dielectric 18 between the conductive strips 16 is etched to remove the dielectric extending from each conductive strip to an adjacent conductive strip and thereby producing empty spaces 28. The dielectric 18 is removed in a region extending all the way from each conductive strip 16 to an adjacent conductive strip and to a level below the level of the bottom of the strips.

As can be seen from FIG. 1D, the empty spaces 28 between and below the level of the conductive strips 16 of FIG. 1C are next completely filled with a second dielectric material 30 having a high dielectric constant, the dielectric constant being greater than the dielectric constant of the first material 18. The second dielectric material 30 can be, for example, barium strontium titanate ($BaSrTiO_3$) or tantalum oxide ($Ta_2O_5$). A film of the second dielectric material 30 can be deposited on the wafer 10 by, for example, chemical vapor deposition (CVD) or plasma assisted chemical vapor deposition (PVD). If each empty space 28 between adjacent conductive strips 16 of the finger capacitors is, for example, 200 nm, then typically a thickness of 150 nm of a conformal high dielectric constant material is deposited as the second material 30. The second material 30 is deposited to above the conductive strips 16 such that the second material extends as much above the conductive strips as it does below the conductive strips to accommodate the fringing electrical fields of the conductive strips. Typically, the second material 30 might extend below the bottom level of a conductive strip 16 by a distance on the order of the width of the conductive strip 16, which is the horizontal dimension of the conductive strip 16 in the drawings, and extends above the conductive strip 16 by the same approximate distance. The extension of the second material 30 above and/or below the conducting strips 16 significantly increases the capacitances of the resulting capacitors due to the fringing electrical fields within the extensions. Extension of the second material 30 above and below the conductive strips 16 by a distance on the order of the width of a conductive strip provides the greatest capacitance.

Figure 1D:
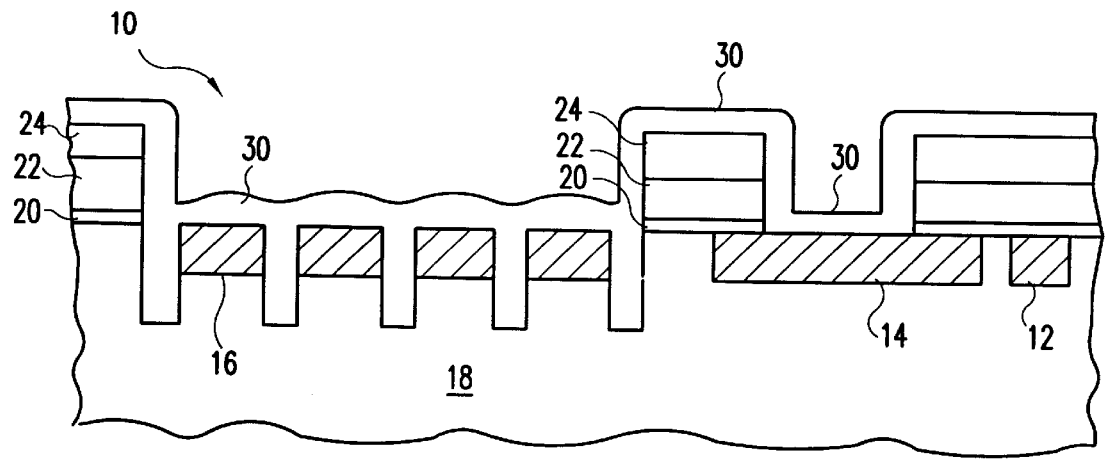
FIG. 1D shows the wafer of FIG. 1C with a dielectric having a second dielectric constant filling the spaces between the finger capacitors.
Figure 1E:
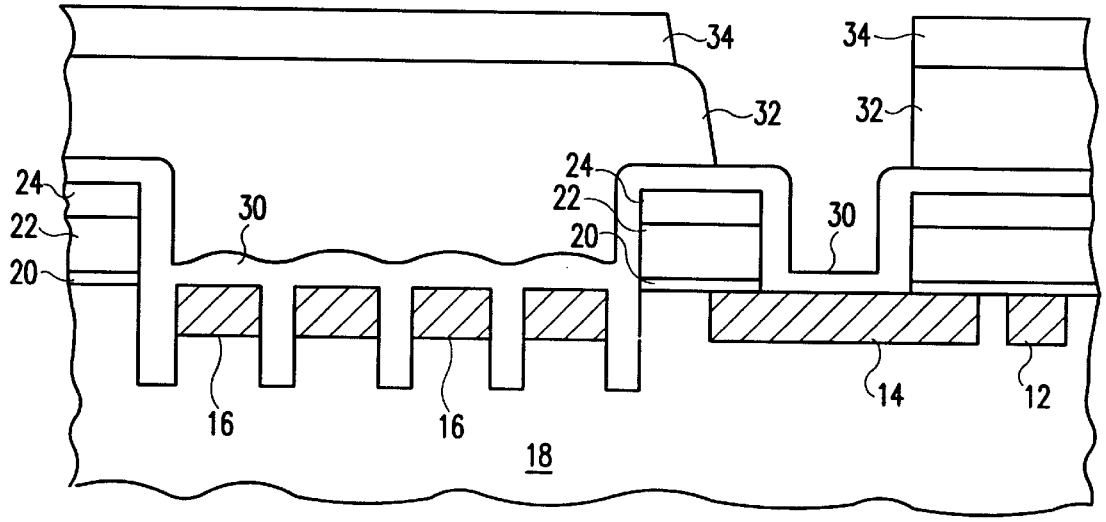
FIG. 1E shows the wafer of FIG. 1D with the final via polyimide applied and developed.

As can be seen from FIG. 1E, a final via polyimide 32 is applied to the wafer 10 of FIG. 1D and developed by conventional processes, including the application of a photoresist 34.

Figure 1F:
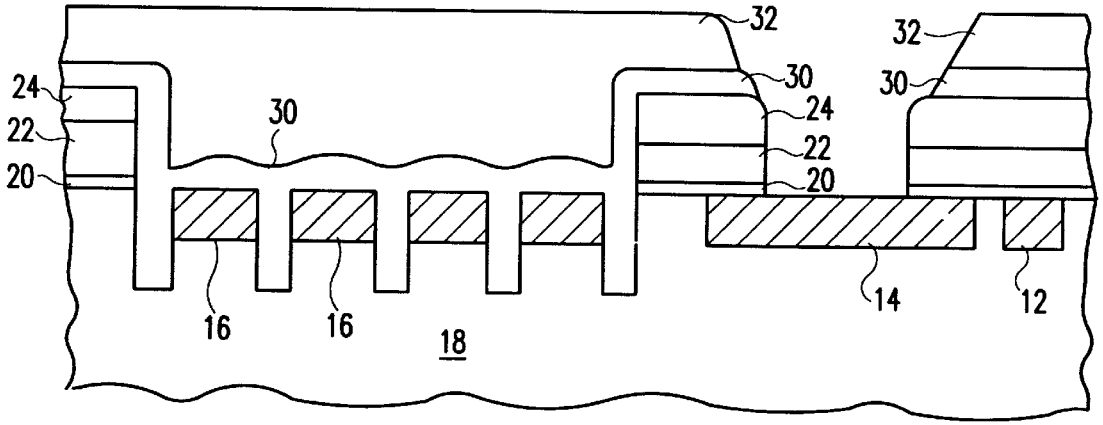
FIG. 1F shows the wafer of FIG. 1C after an etchback to remove the second dielectric material from a bond pad.

As can be seen from FIG. 1F, the wafer 10 of FIG. 1E is etched back to remove the high dielectric constant material 30 from the bond pad 14, and the photoresist 34 is stripped. In this way, vias are formed for connections using standard wirebonds or solder balls. The proportion of high dielectric material 30 immediately between the conductive strips 16 in the resulting capacitors of FIG. 1F is selected so that the dielectric of the capacitors is comprised entirely of the high dielectric material 30. This maximizes the capacitance of the capacitors.

Figure 2:
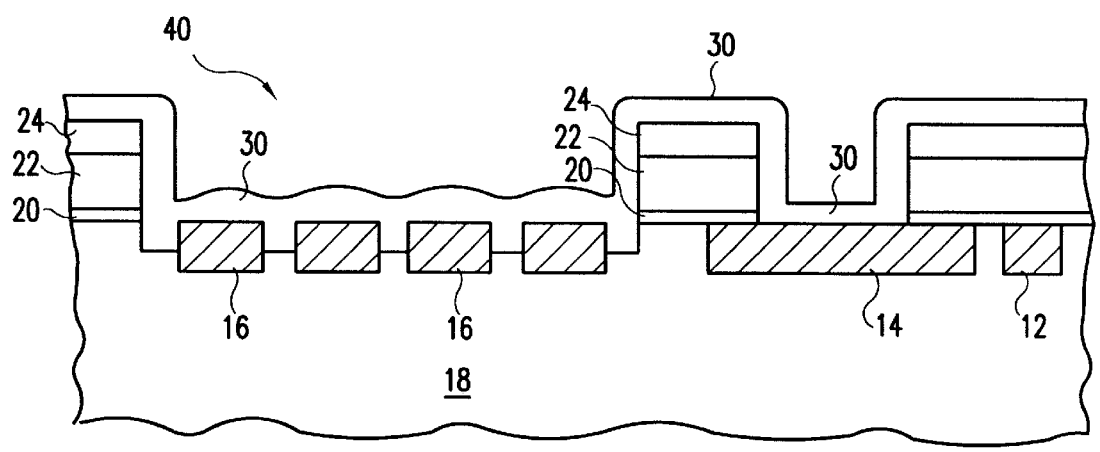
FIG. 2 shows a wafer in which the material of the substrate is only partially removed between the finger capacitors and the resulting spaces are filled with a material having the second dielectric constant.

As can be appreciated by comparing FIG. 2, in which a wafer 40 according to the present invention is shown, with FIG. 1D, the amount of the first dielectric material 18 between and below the conductive elements 16 which is removed by the method according to the present invention, can be limited. As a result, the amount of the second material 30 having the high dielectric constant which fills the spaces between and above the conductive strips 16 is limited, thereby limiting the proportion of the second high dielectric constant material 30 in the composite dielectric of the resulting capacitors. As a result, the capacitance of the resulting capacitors is limited to a value below the capacitance which would exist if the dielectric were comprised entirely of the second, high dielectric constant material 30. By adjusting the proportion of the second, high dielectric constant material 30 to the first, low dielectric constant material 18, the composite dielectric constant of the capacitors and, thus, their capacitance, can be tuned or adjusted. By such a method, the greater the proportion of high dielectric constant material, the greater the capacitance.

The proportion of the first and second dielectric materials 18 and 30 needed to provide a desired capacitance can be estimated, test capacitors containing the estimated amounts can be produced and measured, and the relative proportions of the first and second dielectric materials can be adjusted until the precise amount of capacitance is achieved. Then, production runs of devices having finger capacitors providing the selected capacitance can be made. This procedure can be repeated for other capacitance values for which other proportions of materials having different dielectric constants are required. Nomographs can be produced based on such data, and the nomographs can serve as a guide for selecting the proportions of dielectric materials needed to obtain still other capacitance values.

While the invention has been particularly shown and described with reference to preferred embodiments thereof, it will be understood by those skilled in the relevant art that various changes in form and details may be made therein without departing from the spirit and scope of the invention.

What is claimed is:

1. A method of forming a capacitor in a substrate having an integrated circuit so that the capacitor has a selected dielectric constant from a range of dielectric constants, comprising:

forming in a substrate of a first material having a first dielectric constant a plurality of spaced conductive elements positioned close enough to one another to have a capacitance, a portion of the substrate being between the conductive elements, extending from at least one of the conductive elements to an adjacent one of the conductive elements;

removing at least part of said portion of the substrate to define an empty space between the conductive elements; and placing in said empty space an amount of a second material having a second dielectric constant, wherein the second dielectric constant is greater than the first dielectric constant, whereby the capacitance of the conductive elements after the step of placing said second material in said empty space is greater than the capacitance of the conductive elements prior to the step of removing.

2. The method of claim 1, further comprising selecting the dielectric constant of the capacitor by selecting the amount of said second material which is placed in said empty space relative to the amount of the first material remaining between said conductive elements.

3. The method of claim 1, wherein the step of placing comprises depositing the second material in the empty space by a vapor deposition process.

4. The method of claim 1, wherein the step of removing comprises removing all of the portion of the substrate extending from at least one of the conductive elements to an adjacent one of the conductive elements.

5. The method of claim 4, wherein the step of placing comprises filling said empty space with said second material.

6. The method of claim 5, wherein the step of placing further comprises adding to said second material in said empty space additional second material to a level above the conductive elements, to the top of a region in which significant fringing fields are present when the capacitor is in operation.

7. The method of claim 1, wherein the step of removing comprises removing said portion of the substrate between the conductive elements to a level below the conductive elements, to the bottom of a region in which significant fringing fields are present when the capacitor is in operation.

8. The method of claim 7, wherein the step of placing comprises filling said empty space with said second material.

9. The method of claim 7, wherein the step of placing further comprises adding to said second material in said empty space additional second material to a level above the conductive elements, to the top of a region in which significant fringing fields are present when the capacitor is in operation.

10. The method of claim 1, wherein each conductive element has a width, and the step of removing comprises removing said portion of the substrate between the conductive elements to a level below the conductive elements by a distance substantially equal to the width of each of the conductive elements.

11. The method of claim 10, wherein the step of placing comprises filling said empty space with said second material.

12. A capacitor in a substrate having an integrated circuit, wherein the substrate is made of a first material having a first dielectric constant, and the capacitor has a selected dielectric constant from a range of dielectric constants, comprising:

a plurality of spaced conductive elements positioned close enough to one another to have a capacitance, a portion of the substrate being between the conductive elements, said portion extending from at least one of the conductive elements to an adjacent one of the conductive elements; and an amount of a second material having a second dielectric constant, wherein the second dielectric constant is greater than the first dielectric constant, said second material being between the conductive elements, whereby the capacitance of the conductive elements is greater than it would be if all of the material between the conductive elements were the first material.

13. The capacitor of claim 12, wherein the dielectric constant of the capacitor is determined by the amount of said second material relative to the amount of the first material between said conductive elements.

14. The capacitor of claim 12, wherein said second material extends upward to a level above the conductive elements, to the top of a region in which significant fringing fields are present when the capacitor is in operation.

15. The capacitor of claim 12, wherein each conductive element has a width, and the second material extends downward to a level below the conductive elements by a distance substantially equal to the width of one of the conductive elements.

* * * * *